United States Patent
Sumant et al.

(10) Patent No.: US 12,325,660 B1
(45) Date of Patent: Jun. 10, 2025

(54) METHOD TO CREATE HYDROPHILIC ANTIMICROBIAL DIAMOND COATING

(71) Applicant: United States Department of Energy, Washington, DC (US)

(72) Inventors: Anirudha V. Sumant, Plainfield, IL (US); Shikai Deng, Shanghai (CN)

(73) Assignee: UNITED STATES DEPARTMENT OF ENERGY, Washington, DC (US)

( * ) Notice: Subject to any disclaimer, the term of this patent is extended or adjusted under 35 U.S.C. 154(b) by 22 days.

(21) Appl. No.: 18/414,761

(22) Filed: Jan. 17, 2024

(51) Int. Cl.
| | |
|---|---|
| C03C 17/36 | (2006.01) |
| A01N 59/16 | (2006.01) |
| A01P 1/00 | (2006.01) |
| C23C 16/27 | (2006.01) |
| C23C 16/511 | (2006.01) |
| C23C 16/56 | (2006.01) |
| C23C 28/00 | (2006.01) |

(52) U.S. Cl.
CPC .......... *C03C 17/3607* (2013.01); *A01N 59/16* (2013.01); *A01P 1/00* (2021.08); *C03C 17/3634* (2013.01); *C03C 17/3644* (2013.01); *C23C 16/274* (2013.01); *C23C 16/277* (2013.01); *C23C 16/511* (2013.01); *C23C 16/56* (2013.01); *C23C 28/322* (2013.01); *C23C 28/34* (2013.01); *C03C 2217/75* (2013.01); *C03C 2218/112* (2013.01); *C03C 2218/153* (2013.01)

(58) Field of Classification Search
CPC .............. C23C 16/274; C03C 2217/75; C03C 17/3634; C03C 17/3644
See application file for complete search history.

(56) References Cited

U.S. PATENT DOCUMENTS

| | | | |
|---|---|---|---|
| 9,741,561 B2 | 8/2017 | Sumant et al. | |
| 10,410,860 B2 | 9/2019 | Sumant et al. | |
| 2007/0220959 A1 | 9/2007 | Sumant et al. | |
| 2011/0081395 A1* | 4/2011 | Chiu | C12N 5/0623 435/402 |
| 2019/0127271 A1* | 5/2019 | Veerasamy | C03C 17/3613 |

* cited by examiner

Primary Examiner — Alex A Rolland
(74) Attorney, Agent, or Firm — Andrew C. Stark; Karen L. Blouin

(57) ABSTRACT

A method for creating a hydrophilic antimicrobial diamond coating on a silicon or glass surface includes providing a silicon or glass surface, creating a second surface by seeding a plurality of nanodiamond particles on the silicon or glass surface by microwave plasma chemical vapor deposition (MPCVD), and forming a silver nitrate and hydroxylamine solution. A third surface may be created by seeding a plurality of silver nanoparticles onto the second surface by spraying the silver nitrate and hydroxylamine solution onto the second surface and maintaining the silver nitrate and hydroxylamine solution on the second surface for a predetermined time. The third surface may then be exposed to an oxygen plasma treatment.

20 Claims, 6 Drawing Sheets

METHOD TO CREATE HYDROPHILIC ANTIMICROBIAL DIAMOND COATING

GOVERNMENT INTERESTS

The United States Government has rights in this invention pursuant to Contract No. DE-AC02-06CH11357 between the U.S. Department of Energy (DOE) and UChicago Argonne, LLC.

FIELD OF THE INVENTION

Embodiments of the invention relate to creating hydrophilic antimicrobial diamond coatings on glass or other surfaces.

BACKGROUND OF THE INVENTION

Bacterial attachment and formation of biofilms on glass or other surfaces is problematic, particularly in sanitary environments (e.g. hospitals). Optically transparent coatings on glass surfaces having anti-bacterial, anti-fog features along with excellent scratch resistance could be beneficial for various flat panel display applications as well as self-cleaning glass or windows used in such environments. Currently, there are number of thin film coatings and surface pre-treatments available to make glass surfaces super hydrophilic so that they can have self-cleaning/or anti-fogging properties. However, few of these coatings or surface pre-treatments make glass surface scratch resistant or resistant to bacterial and protein adhesion.

Due to its chemical and mechanical properties, ultrananocrystalline diamond (UNCD) has been recognized as an extremely attractive material for glass coatings, in particular, UNCD coatings provide excellent scratch resistance. However, UNCD coatings currently available typically do not have a wide range of other desirable properties. Often there is a significant trade-off between scratch resistance and visual transparency. Additionally, some UNCD coatings are anti-fogging but have low transparency. In addition, few UNCD coatings demonstrate antibacterial properties. As a result, there is a need for a UNCD coating that is hydrophilic, shows antibacterial activity, has high visual transparency, and demonstrates anti-fogging properties.

SUMMARY OF THE INVENTION

In accordance with one aspect of the invention, a method for creating a hydrophilic antimicrobial diamond coating on a silicon or glass surface includes providing a silicon or glass surface, creating a second surface by seeding a plurality of nanodiamond particles on the silicon or glass surface by microwave plasma chemical vapor deposition (MPCVD) such that each of the plurality of nanodiamond particles have a grain size of approximately 2-5 nm, and forming a silver nitrate and hydroxylamine solution by mixing a silver nitrate solution of approximately 0.03-0.08 mg/L with hydroxylamine at a predetermined temperature. The method continues by creating a third surface that may include seeding a plurality of silver nanoparticles onto the second surface by spraying the silver nitrate and hydroxylamine solution onto the second surface, and maintaining the silver nitrate and hydroxylamine solution on the second surface for a predetermined time. The third surface may be exposed to an oxygen plasma treatment for 10-40s, at a power of approximately 40 W, a pressure of 100-200 mTorr, and an oxygen flow rate of 20-25 sccm.

In accordance with another aspect of the invention, a method for creating a hydrophilic antimicrobial diamond coating on a silicon or glass surface includes providing a silicon or glass surface, creating a second surface by seeding a plurality of nanodiamond particles on the silicon or glass surface by microwave plasma chemical vapor deposition (MPCVD) such that each of the plurality of nanodiamond particles have a grain size of approximately 2-5 nm, and creating a third surface by exposing the second surface to an oxygen plasma treatment for 10-40s, at a power of approximately 40 W, a pressure of 100-200 mTorr, and an oxygen flow rate of 20-25 sccm. The method may continue by forming a silver nitrate and hydroxylamine solution by mixing a silver nitrate solution of approximately 0.03-0.08 mg/L with hydroxylamine at a predetermined temperature. A plurality of silver nanoparticles may be seeded onto the third surface by spraying the silver nitrate and hydroxylamine solution onto the third surface, and the silver nitrate and hydroxylamine solution may be maintained on the third surface for a predetermined time.

These and other features and advantages the invention will be more readily understood from the following detailed description and accompanying drawings.

BRIEF DESCRIPTION OF THE DRAWINGS

Embodiments of the present invention are illustrated in the accompanying figures where.

DETAILED DESCRIPTION OF THE INVENTION

The following detailed description provides illustrations for embodiments of the present invention. Those skilled in the art will recognize that other embodiments for carrying out or practicing the present invention are also possible. Embodiments of the invention relate to producing a hydrophilic antimicrobial diamond coating onto a glass or silicon surface. However, the invention is equally applicable to producing a hydrophilic antimicrobial diamond coating onto surfaces other than glass and silicon surfaces.

Figure 1:
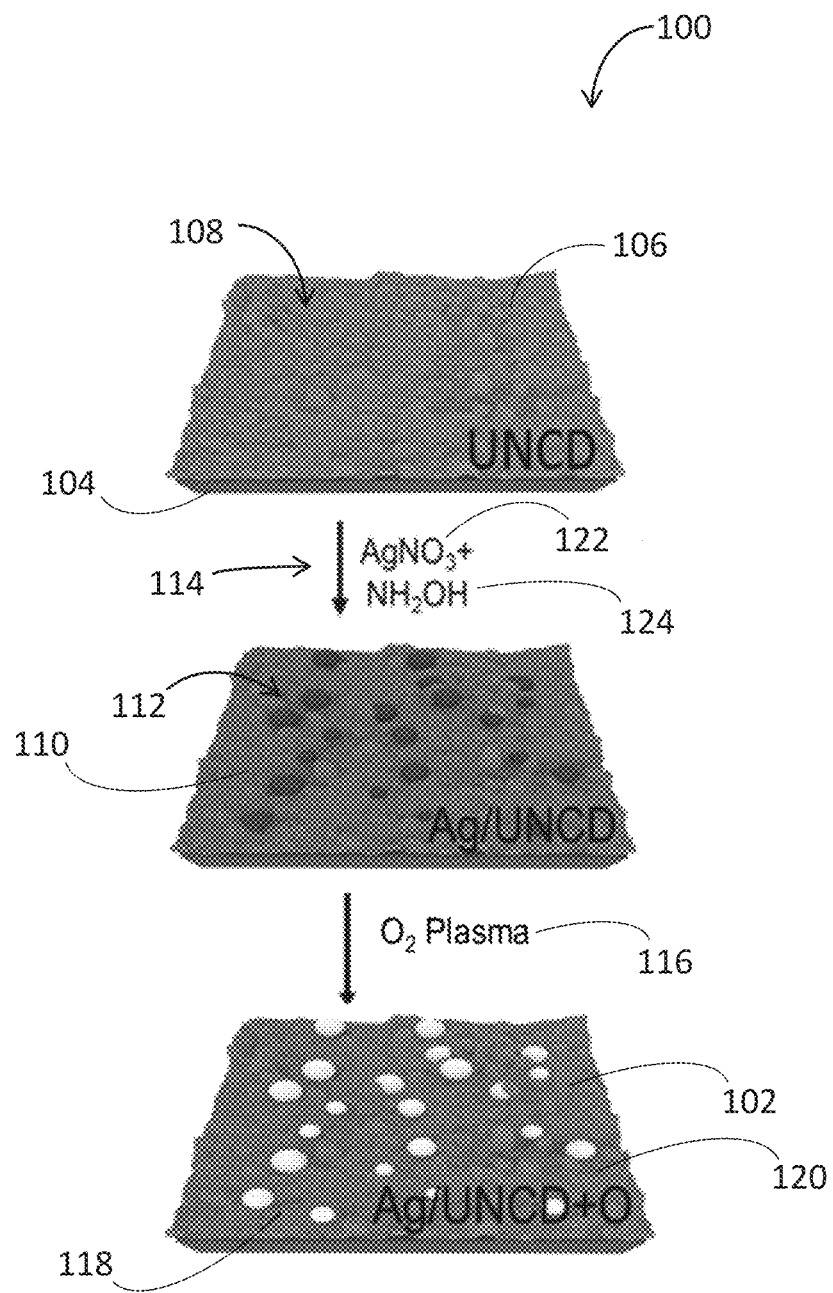
FIG. 1 is a process for producing a hydrophilic antimicrobial diamond coating onto a surface, according to embodiments of the invention.

Referring to FIG. 1, a process 100 for producing a hydrophilic antimicrobial diamond coating 102 is shown, according to embodiments of the invention. The hydrophilic antimicrobial diamond coating 102 is created by providing a first surface 104 that may comprise a glass surface or a silicon surface. In embodiments of the invention, a glass surface being coated is a borosilicate glass, which has a higher temperature stability than other glasses. In alternate embodiments, the glass may be silicon oxide, quartz, sapphire, fused silica, diamond, Pyrex, aluminum oxide, magnesium oxide, indium tin oxide, transparent ceramics or any other transparent materials that produce acceptable results. The silicon surface may be a silicon wafer suitable for use in fabricating integrated circuits or, in photovoltaics, to manufacture solar cells. The silicon wafer may be a clean silicon wafer cleaned by one or more of many well-known techniques (e.g. solvent cleaning, RCA cleaning, hydrofluoric acid dip, and/or deionized water (DI) rinse, etc.).

A second surface 106 may then be formed by seeding a plurality of nanodiamond particles 108 on the first surface 104. The plurality of nanodiamond particles 108 may be seeded on the first surface 104 by microwave plasma chemical vapor deposition (MPCVD) for approximately three hours such that the nanodiamond particles 108 have a grain size of approximately 2-5 nanometers (nm). The plurality of nanodiamond particles 108 may be seeded on the first surface 104 by MPCVD for any sufficient amount of time to form nanodiamond particles 108 having a grain size of approximately 2-5 nm. In embodiments of the invention, the plurality of nanodiamond particles 108 are seeded on the first surface 104 by MPCVD for between approximately 2-4 hours but could be seeded by MPCVD for at least or up to approximately 0.25, 0.5, 0.75, 1, 2, 3, 4, 5, 6, 7 or 8 hours.

A third surface 110 may be created by seeding a plurality of silver nanoparticles 112 (AgNPs) on the second surface 106. The plurality of silver nanoparticles 112 may be seeded onto the second surface 106 by spraying a solution 114 onto the second surface 106 where the solution 114 includes a mixture of silver nitrate solution 122 of approximately 0.03-0.08 milligrams per liter (mg/L) with hydroxylamine 124 mixed at a predetermined temperature, with the solution 114 being maintained on the second surface 106 for a predetermined time. The third surface 110 may be exposed to oxygen plasma 116 for 10-40 seconds(s), at a power of approximately 40 watts (W), a pressure of 100-200 millitorr (mTorr), and oxygen flow of 20-25 standard cubic centimeters per minute (sccm) thereby creating a fourth surface 118 referred to as the hydrophilic antimicrobial diamond coating 102. According to various embodiments, the hydrophilic antimicrobial diamond coating 102 may exhibit a water contact angle equal to zero degrees, or approximately zero degrees (i.e. less than 1 degree), thus forming a superhydrophilic antimicrobial diamond coating (SADC) 120 formed on a glass surface or other surface. The resulting hydrophilic antimicrobial diamond coating 102 (e.g. SADC 120) on the first surface 104 is characterized as an Ag/UNCD+O coating. Accordingly, FIG. 1 shows an Ag/UNCD surface is produced from a UNCD surface with an $AgNO_3+NH_2OH$ treatment and can be refined with an $O_2$ plasma into an Ag/UNCD+O surface.

Figure 2:
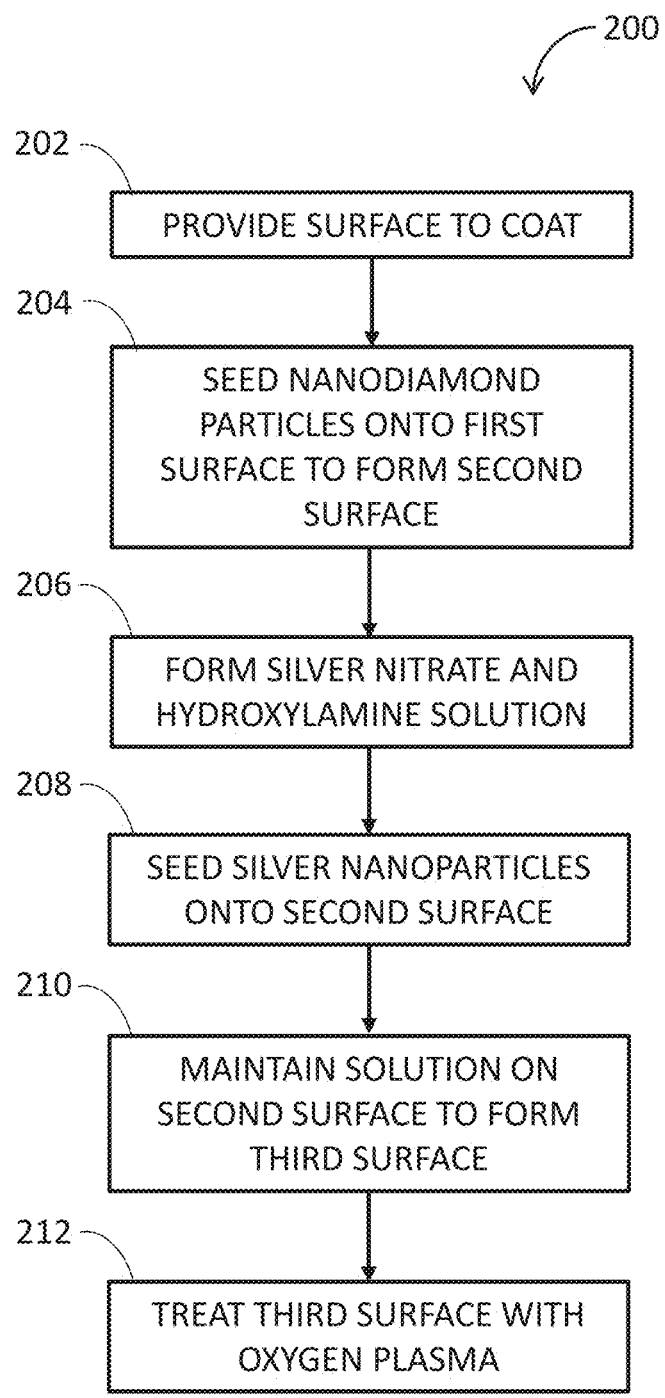
FIG. 2 is a schematic flow diagram illustrating steps in the process of FIG. 1 for producing a hydrophylic antimicrobial diamond coating onto a surface, according to embodiments of the invention.

Referring now to FIG. 2 with continued reference back to FIG. 1, a schematic block diagram illustrating a process 200 for creating a hydrophilic antimicrobial diamond coating on a first surface 104 is shown, according to embodiments of the invention. The process 200 begins at STEP 202 by providing the first surface 104, which may comprise a glass surface, a silicon surface, or any surface described as the first surface with respect to FIG. 1. At STEP 204 a plurality of nanodiamond particles 108 are seeded (e.g. forming crystals via condensation and/or deposition) on the first surface 104 by microwave plasma chemical vapor deposition (MPCVD) thereby creating a second surface 106 comprising ultrananocrystalline diamond (UNCD). MPCVD includes a chamber that generates a plasma ball using a microwave plasma source in the presence of a mixture of gases flowing into the chamber with a chamber pressure lower than atmospheric pressure. In embodiments of the invention, the gases are hydrogen ($H_2$), methane ($CH_4$), and argon (Ar). Argon may make up a majority proportion of the gas within the chamber. In embodiments of the invention, the MPCVD uses inputs of: $CH_4$=1.2 sccm, $H_2$=17 sccm, and Ar=400 sccm, or approximations thereof. MPCVD systems currently use frequencies of 915 megahertz (MHz) and 2.45 gigahertz (GHz) for chemical vapor deposition. The microwave plasma source may have a frequency of 915 MHz, which provides larger size plasma compared to 2.45 GHz frequency microwave plasma systems.

Each of the plurality of nanodiamond particles 108 deposited by the plasma ball may have a grain size less than or equal to approximately 5 nm. In embodiments of the invention, the nanodiamond particles 108 may be formed on the first surface 104 to have either a grain size or a circumference of between 2-5 nm, or approximations thereof. The microwave plasma chemical vapor deposition may hold the plasma at 800 degrees Celsius (° C.) with an input power of 2100-2300 W for 3 hours to create nanodiamond particles 108 having a grain size between approximately 2-5 nm. The average deposition rate of UNCD when depositing nanodiamond particles 108 using plasma at 800° C. is approximately 100-200 nm/hour. In embodiments of the invention, the plasma temperature may be between approximately 400° C. to 800° C., and the second surface 106 may have a thickness between approximately 200 nm to 600 nm.

Following the MPCVD process, at STEP 206 a silver nitrate and hydroxylamine solution 114 is formed, in embodiments of the invention. A plurality of silver nanoparticles 112 may be produced by mixing silver nitrate solution 122 with hydroxylamine 124 at a predetermined temperature. In embodiments of the invention, the silver nitrate solution 122 includes approximately 0.03-0.08 mg/L of water with the hydroxylamine 124 sufficient to nucleate the silver. The predetermined temperature may be room temperature or 20-25° C. At STEP 208, the plurality of silver nanoparticles 112 may be seeded onto the second surface 106 by spraying the silver nitrate and hydroxylamine solution 114 onto the second surface 106 allowing deposition of silver nanoparticle 112 onto the second surface 106. Next, STEP 210 may include maintaining the silver nitrate and hydroxylamine solution 114 on the second surface 106 for a predetermined time creating a third surface 110. In embodiments of the invention, the silver nitrate and hydroxylamine solution 114 is maintained on the second surface 106 at room temperature for approximately 2 hours. For example, the silver nitrate and hydroxylamine solution 114 may be maintained on the second surface 106 by additional spraying, immersing the surface in the solution, or any other acceptable method or applying the solution known to those skilled in the art. Seeding silver nanoparticles (AgNPs) 112 onto an untreated UNCD surface at room temperature results in a high density of deposited silver nanoparticles 112 since the formation of AgNPs on a bare UNCD surface is dominated by the surface reaction $3AgNO_3+NH_2OH \rightarrow 3Ag+3HNO_3+NO$. Other embodiments may include the second surface 106 having a longer duration exposure to the silver nitrate and hydroxylamine solution 114 by using a low-temperature exposure (approximately 12 or more hours at 4° C.) or a shorter duration exposure using a microwave reaction (approximately 100 seconds). Any duration and temperature may be used to synthesize silver nanoparticles 112 on the UNCD surface that produces acceptable results, preferably greater than 2.0% coverage of sub-100 nm silver nanoparticles according to embodiments of the invention. For example, the silver nitrate and hydroxylamine solution 114 may be maintained on the second surface 106 at a temperature of between 1-30° C. (and integers therebetween) for a duration of 1-20 hours (and integers therebetween).

At STEP 212 the third surface 110 is exposed to an oxygen plasma treatment 116 creating a fourth surface 118. Previously, oxygen plasma has been used for selectively etching patterns onto UNCD surfaces (see, e.g. US 2007/0220959). However, in embodiments of the current invention, the third surface 110 is placed in a vacuum chamber and exposed to an oxygen plasma 116 at room temperature or 20-25° C. for a short duration to alter the surface termination of the UNCD surface over the entire exposed surface area. In embodiments of the invention, oxygen plasma treatment 116 may be for 40s, at a power of 40 W, a pressure of 160 mTorr, and an oxygen flow rate of 22 sccm. In other embodiments, oxygen plasma 116 exposure is for 10-40s, at a power of approximately 40 W, a pressure of 100-200 mTorr, and an oxygen flow rate of 20-25 sccm.

In embodiments of the invention, the hydrophilic antimicrobial diamond coating 102 (Ag/UNCD+O coating) on the first surface 104 (e.g. silicon or glass surface) transmits light up to 90% in the visible spectrum. The Ag/UNCD+O coating on a silicon or glass surface may be optically transparent while maintaining at least 87% optical transmission throughout the visible spectrum. The Ag/UNCD+O coating may have a water contact angle of approximately zero degrees thus comprising a superhydrophilic antimicrobial diamond coating (SADC) 120 on a silicon or glass surface. The SADC 120 may be anti-fogging and/or may reduce bacterial attachment to approximately zero percent coverage (i.e. less than 1% coverage).

Figure 3:
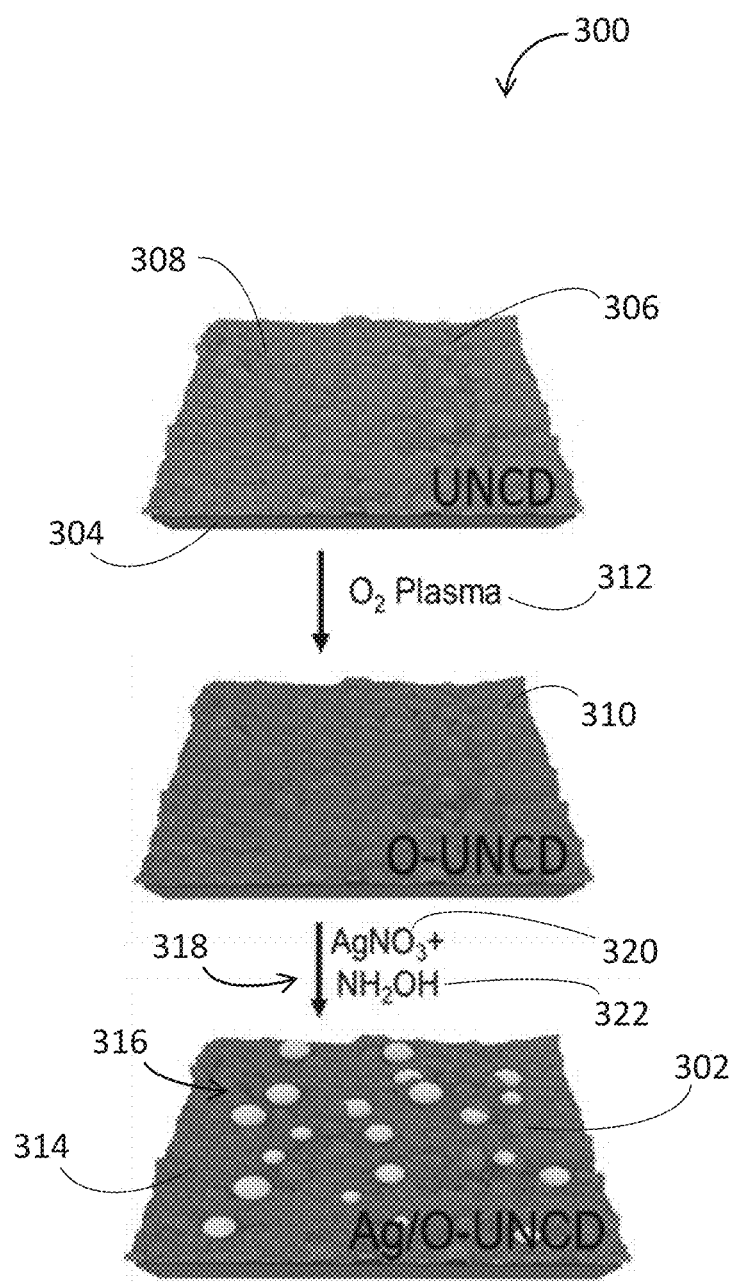
FIG. 3 is a process for producing a hydrophilic antimicrobial diamond coating onto a surface, according to embodiments of the invention.

Referring to FIG. 3, a process 300 for producing a hydrophilic antimicrobial diamond coating 302 is shown, according to embodiments of the invention. The hydrophilic antimicrobial diamond coating 302 may be created by providing a first surface 304 that may comprise a glass surface, a silicon surface, or any suitable surface described as the first surface with respect to FIG. 1. Referring back to FIG. 3, a second surface 306 is then formed by seeding a plurality of nanodiamond particles 308 on the first surface 304. The plurality of nanodiamond particles 308 may be seeded on the first surface 304 by microwave plasma chemical vapor deposition (MPCVD) for approximately three hours such that the nanodiamond particles 308 have a grain size of approximately 2-5 nm. The plurality of nanodiamond particles 308 may be seeded on the first surface 304 by MPCVD for any sufficient amount of time to form nanodiamond particles 308 having a grain size of approximately 2-5 nm. In embodiments of the invention, the plurality of nanodiamond particles 308 are seeded on the first surface 304 by MPCVD for between approximately 2-4 hours but could be seeded by MPCVD for at least or up to approximately 0.25, 0.5, 0.75, 1, 2, 3, 4, 5, 6, 7 or 8 hours.

A third surface 310 may be created by exposing the second surface 306 to oxygen plasma 312 for 10-40s, at a power of approximately 40 W, a pressure of 100-200 mTorr, and oxygen flow of 20-25 sccm. A fourth surface 314 may be created by seeding a plurality of silver nanoparticles 316 onto the third surface 310. The plurality of silver nanoparticles 316 may be seeded onto the third surface 310 by spraying a solution 318 onto the third surface 310 where the solution includes a mixture of silver nitrate solution 320 of approximately 0.03-0.08 mg/L with hydroxylamine 322 mixed at a predetermined temperature, with the solution 318 being maintained on the third surface 310 for a predetermined time. The resulting hydrophilic antimicrobial diamond coating 302 on the first surface 304 is characterized as an Ag/O-UNCD coating. Accordingly, FIG. 3 shows an O-UNCD surface is produced from a UNCD surface with $O_2$ plasma and can be further refined with $AgNO_3+NH_2OH$ into an Ag/O-UNCD surface.

Figure 4:
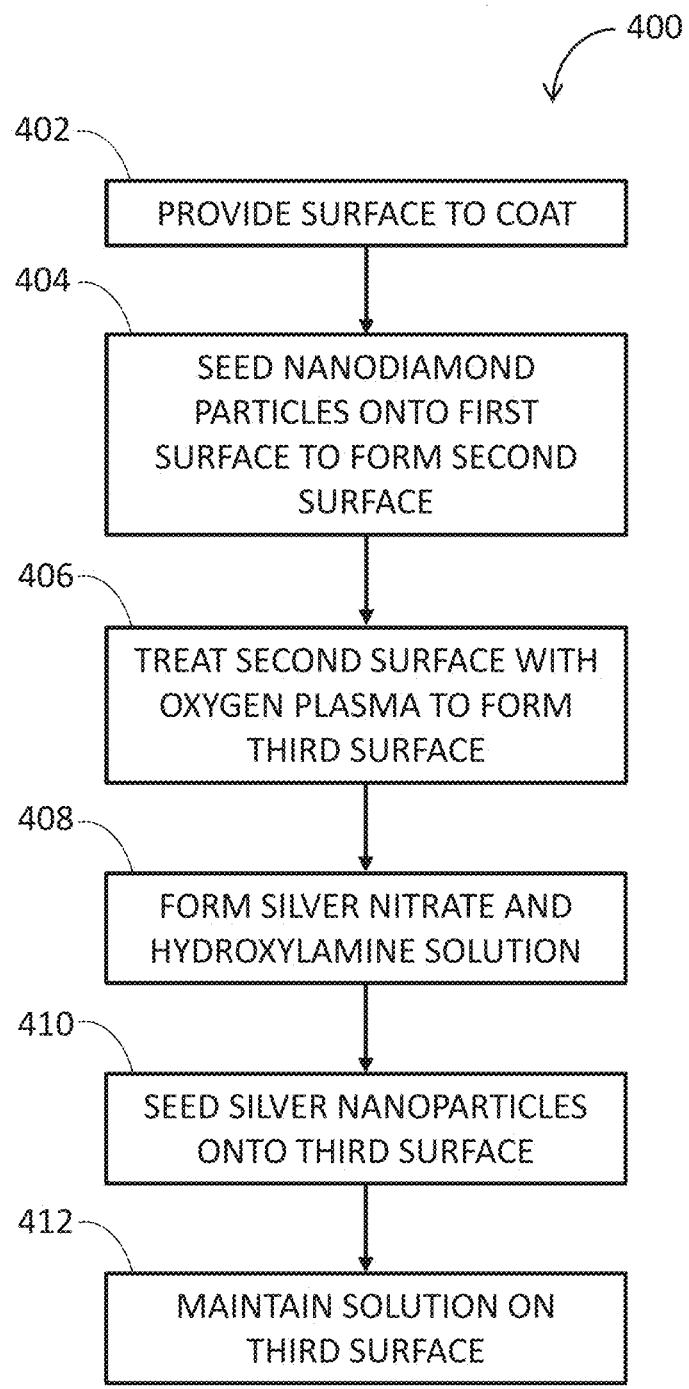
FIG. 4 is a schematic flow diagram illustrating steps in the process of FIG. 3 for producing a hydrophylic antimicrobial diamond coating onto a surface, according to embodiments of the invention.

Referring now to FIG. 4 with continued reference back to FIG. 3, a schematic block diagram illustrating a process 400 for creating a hydrophilic antimicrobial diamond coating on a first surface 304 is shown, according to an embodiment of the invention. The process 400 begins at STEP 402 by providing the first surface 304 which may comprise a glass surface, a silicon surface, or any surface described as the first surface 104 with respect to FIG. 1. Referring back to FIGS. 3-4, a plurality of nanodiamond particles 308 are seeded on the first surface 304 by microwave plasma chemical vapor deposition (MPCVD) thereby creating a second surface 306 comprising ultrananocrystalline diamond (UNCD) at STEP 404. MPCVD includes a chamber that generates a plasma ball using a microwave plasma source in the presence of a mixture of gases flowing into the chamber with a chamber pressure lower than atmospheric pressure. In embodiments of the invention, the gases are hydrogen ($H_2$), methane ($CH_4$), and argon (Ar). Argon may make up the majority of the gas within the chamber. In embodiments of the invention, the MPCVD uses inputs of: $CH_4$=1.2 sccm, $H_2$=17 sccm, and Ar=400 sccm, or approximations thereof. The microwave plasma source may have a frequency of 915 MHz, which provides larger size plasma compared to 2.45 GHz frequency microwave plasma systems.

Each of the plurality of nanodiamond particles 308 deposited by the plasma ball may have a grain size less than or equal to approximately 5 nm. In embodiments of the invention, the nanodiamond particles 308 may be formed on the first surface 304 to have either a grain size or a circumference of between 2-5 nm, or approximations thereof. The microwave plasma chemical vapor deposition may hold the plasma at 800° C. with an input power of 2100-2300 W for 3 hours to create nanodiamond particles 308 having a grain size between approximately 2-5 nm. The average deposition rate of UNCD when depositing nanodiamond particles 308 using plasma at 800° C. is approximately 100-200 nm/hour, resulting in a UNCD layer of around 300-600 nm. In embodiments of the invention, the plasma temperature may be a value between approximately 400° C. to 800° C., and the second surface 306 may have a thickness between approximately 200 nm to 600 nm.

Following the MPCVD process, at STEP 406 the second surface 306 may be treated with an oxygen plasma 312 creating a third surface 310. In embodiments of the invention, the second surface 306 is placed in a vacuum chamber and exposed to an oxygen plasma 312 at room temperature or 20-25° C. for a short duration to alter the surface termination of the UNCD surface over the entire exposed surface area. In embodiments of the invention, oxygen plasma treatment 312 may be for 40s, at a power of 40 W, a pressure of 160 mTorr, and an oxygen flow rate of 22 sccm. In other embodiments, oxygen plasma 312 exposure is for 10-40s, at a power of approximately 40 W, a pressure of 100-200 mTorr, and an oxygen flow rate of 20-25 sccm.

After oxygen plasma treatment 312, the process 400 continues at STEP 408 by forming a silver nitrate and hydroxylamine solution 318, according to embodiments of the invention. A plurality of silver nanoparticles 316 are prepared by mixing silver nitrate solution 320 (e.g. 0.03-0.08 mg/L) with hydroxylamine 322 at a predetermined temperature. In embodiments of the invention, the silver nitrate solution 320 includes approximately 0.03-0.08 mg/L of water with hydroxylamine 322 sufficient to nucleate the silver. The predetermined temperature may be room temperature or 20-25° C. At STEP 410, the plurality of silver nanoparticles 316 may be seeded onto the third surface 310 by spraying the silver nitrate and hydroxylamine solution 318 onto the third surface 310, allowing deposition of silver nanoparticle 316 onto the third surface 310. Next, the solution 318 may be maintained on the third surface 310 for a predetermined time creating a fourth surface 314 at STEP 412. In embodiments of the invention, the silver nitrate and hydroxylamine solution 318 is maintained on the third surface 310 at room temperature for approximately 2 hours. For example, the silver nitrate and hydroxylamine solution 318 may be maintained on the third surface 310 by additional spraying, immersing the surface in the solution, or any other acceptable method of applying the solution known to those skilled in the art. The oxygen groups on the surface of O-UNCD provide a high density of nucleation sites for the formation of silver nanoparticles 316, which greatly facilitates the growth of AgNPs. However, embodiments may include the third surface 310 having a longer duration exposure to the silver nitrate and hydroxylamine solution 318 using a low-temperature exposure (approximately 12 or more hours at 4° C.) or a shorter duration exposure using a microwave reaction (approximately 100 seconds). Any duration and temperature may be used to synthesize silver nanoparticles 316 on the UNCD surface that produces acceptable results, preferably greater than 2.0% coverage of sub-100 nm silver nanoparticles according to embodiments of the invention. For example, the silver nitrate and hydroxylamine solution 318 may be maintained on the third surface 310 at a temperature of between 1-30° C. (and integers therebetween) for a duration of 1-20 hours (and integers therebetween).

In embodiments of the invention, the hydrophilic antimicrobial diamond coating 302 (Ag/O-UNCD coating) on the first surface 304 (e.g. silicon or glass surface) transmits light up to 90% in the visible spectrum. The AG/O-UNCD coating on a silicon or glass surface may be optically transparent while maintaining at least 87% optical transmission throughout the visible spectrum. The Ag/O-UNCD coating may be anti-fogging and/or may reduce bacterial attachment.

Figure 5:
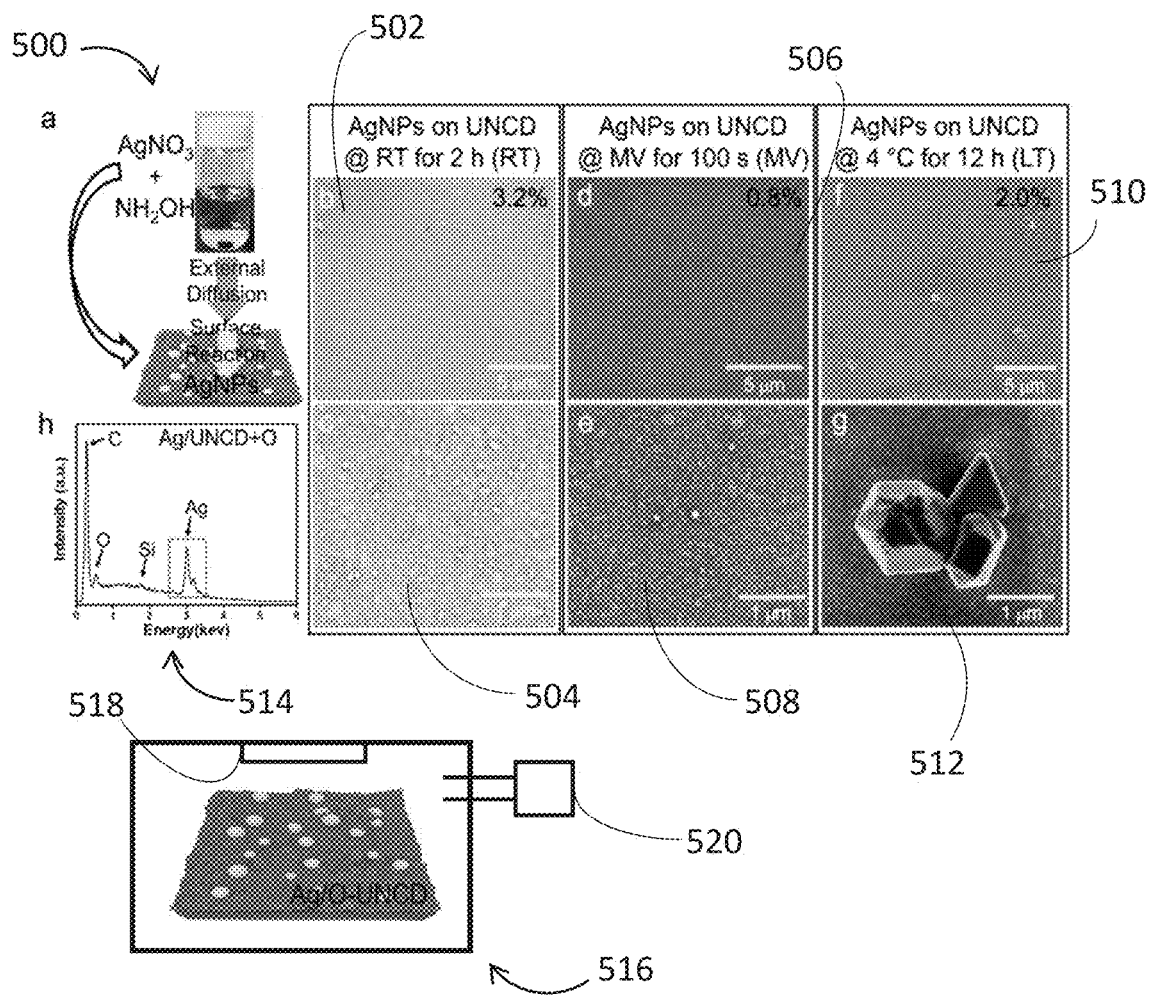
FIG. 5 is a schematic illustration of silver nanoparticles (AgNPs) being synthesized on UNCD surfaces at different conditions, an energy-dispersive x-ray spectroscopy (EDS) spectrum of AgNPs on a UNCD sample, and a plasma chamber used to treat UNCD surfaces, according to embodiments of the invention.

FIG. 5 illustrates detail images of silver nanoparticles on an ultrananocrystalline diamond (UNCD) surface, according to embodiments of the invention. Schematic illustration 500 depicts the silver nanoparticles (AgNPs) being synthesized on a UNCD surface. In some embodiments, the UNCD surface may be treated with oxygen plasma prior to silver nanoparticle synthesis, while in other embodiments, the UNCD surface may be treated with oxygen plasma after silver nanoparticle synthesis. Thus, an Ag/UNCD surface may be an intermediary product used to create an Ag/UNCD+O surface but could provide a scratch resistant antimicrobial surface without oxygen plasma treatment, according to embodiments of the invention. FIG. 5 also shows scanning electron microscopy (SEM) images 502, 504, 506, 508, 510, 512 depicting magnified images of Ag-UNCD surfaces that were formed at three different conditions (room temperature for 2 hours (RT), microwave reaction for 100 seconds (MV), and 4° C. for 12 hours (LT)), producing different sizes and densities of silver nanoparticles on the UNCD surface. The size and density of silver nanoparticles were characterized using SEM and compositions of the nanoparticles were confirmed using energy-dispersive x-ray spectroscopy (EDS). SEM images 502, 504 show the AgNPs synthesized on UNCD at room temperature for 2 hours with a scale at 5 micrometers (μm) and 1 μm, respectfully. The percentage of silver nanoparticle coverage of the surface from SEM images 502, 504 is 3.2%. SEM images 506, 508 show the AgNPs on UNCD synthesized by microwave reaction for 100 seconds with a scale at 5 μm and 1 μm, respectfully. The percentage of silver nanoparticle coverage of the surface from SEM images 506, 508 is 0.8%. SEM images 510, 512 show the AgNPs synthesized on the UNCD surface at 4° C. for 12 hours with a scale at 5 μm and 1 μm, respectfully. The percentage of silver nanoparticle coverage of the surface from SEM images 510, 512 is 2.0%. Spectrum image 514 shows an energy-dispersive x-ray spectroscopy (EDS) spectrum on AgNPs on an Ag/UNCD+O sample, that may be a surface generated by process 200 of FIG. 2.

Referring back to FIG. 5, a similar size and shape of sub-100 nm silver nanoparticles were formed on UNCD surfaces by the RT and MV methods as shown in SEM images 504 and 508, respectively. However, the density of nanoparticles by RT method is significantly higher than that on samples by MV method. The LT method demonstrated a lower silver nanoparticle density than the RT method and a higher density than the MV method, but had larger polyhedral shaped particles as shown in SEM image 512. FIG. 5 also shows a plasma chamber 516 with a microwave plasma source 518 and a gas source 520 used to treat a surface using MPCVD or oxygen-plasma.

Figure 6:
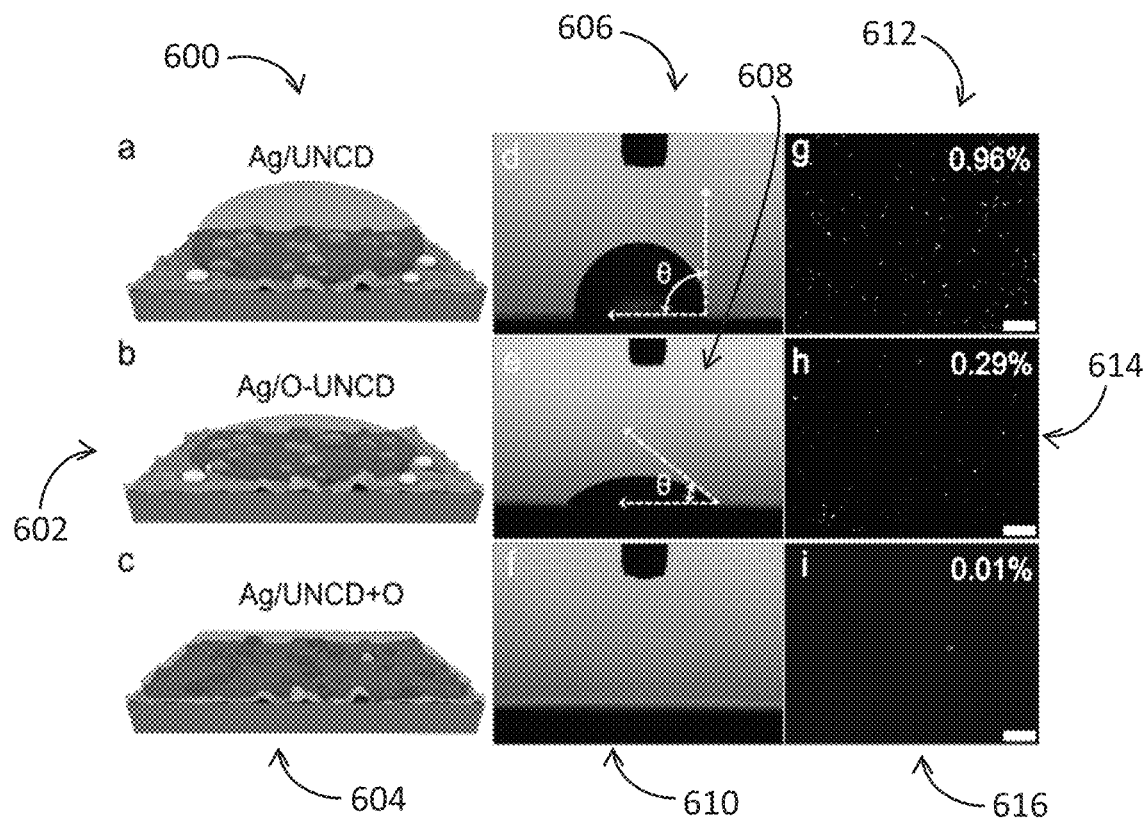
FIG. 6 is schematic illustrations of water on UNCD surfaces and detail views of water contact angles and bacterial attachment on UNCD surfaces, according to embodiments of the invention.

FIG. 6 illustrates schematic and detail views of water contact angles and detail views of bacterial attachment on UNCD surfaces with silver nanoparticles formed on the surfaces at room temperature (RT method discussed above). Schematic illustration 600 shows water on AgNPs on UNCD (Ag/UNCD), schematic illustration 602 shows water on AgNPs on O-UNCD (Ag/O-UNCD), and schematic illustration 604 shows water on AgNPs on UNCD+O (Ag/UNCD+O or SADC). Detail view 606 shows the water contact angle of the untreated Ag/UNCD surface shown in schematic illustration 600 with a water contact angle of approximately 90 degrees. Detail view 608 shows the water contact angle of the Ag/O-UNCD surface shown in schematic illustration 602 with a water contact angle of approximately 45 degrees. Detail view 610 shows the water contact angle of the Ag/UNCD+O surface shown in schematic illustration 604 with a water contact angle of approximately zero degrees. According to embodiments of the invention, the water contact angle reduces with a higher density of AgNPs formed on an oxygen treated UNCD surface (i.e. Ag/O-UNCD or Ag/UNCD+O). As a result, the existence of AgNPs and oxygen plasma can dramatically tune the surface properties of the UNCD, according to embodiments of the invention.

Detail view 612 shows a fluorescence microscopy image of E. coli K12 on Ag/UNCD. The percentage of silver nanoparticle coverage on the sample of detail view 612 is 0.96%. Detail view 614 shows a fluorescence microscopy image of E. coli K12 on Ag/O-UNCD. The percentage of silver nanoparticle coverage on the sample of detail view 614 is 0.29%. Detail view 616 shows a fluorescence microscopy image of E. coli K12 on Ag/UNCD+O. The percentage of silver nanoparticle coverage on the sample of detail view 616 is 0.01%. As shown by the reduction in E. coli K12 speckles from detail view 612 to detail view 614, Ag/O-UNCD has improved antimicrobial properties over Ag/UNCD, and Ag/UNCD+O has improved antimicrobial properties over Ag/O-UNCD as shown by the reduction in *E. coli* K12 speckles from detail view 614 to detail view 616. Not only can antibacterial properties of silver from the silver nanoparticles on UNCD surfaces reduce bacterial attachment, but bacterial attachment on UNCD surfaces can be reduced or eliminated by increasing the hydrophilicity of the UNCD surface. Hydrophilicity of a UNCD surface can be increased by adding silver nanoparticles and applying an oxygen plasma treatment. In addition, the Ag/UNCD+O surface shows a superhydrophilic phenomenon, as the water contact is approximately 0 degrees, and its surface shows almost no bacterial attachment.

Therefore, embodiments of the invention provide a novel method for creating hydrophilic antimicrobial diamond coatings on glass or other surfaces. Embodiments of the invention provide a transparent UNCD coating with several benefits over previous glass coatings including, for example: (1) having a transparency of greater than 90%; (2) coating processes at low temperatures; (3) having extreme hardness, wear resistance and scratch resistance; (4) providing hydrophilic or superhydrophilic properties; (5) anti-fogging capabilities; and/or (6) antibacterial properties.

Having described the basic concept of the embodiments, it will be apparent to those skilled in the art that the foregoing detailed disclosure is intended to be presented by way of example. Accordingly, these terms should be interpreted as indicating that insubstantial or inconsequential modifications or alterations and various improvements of the subject matter described and claimed are considered to be within the scope of the spirited embodiments as recited in the appended claims. Additionally, the recited order of the elements or sequences, or the use of numbers, letters or other designations therefore, is not intended to limit the claimed processes to any order except as may be specified. All ranges disclosed herein also encompass any and all possible sub-ranges and combinations of sub-ranges thereof. Any listed range is easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as up to, at least, greater than, less than, and the like refer to ranges which are subsequently broken down into sub-ranges as discussed above. As utilized herein, the terms "about," "substantially," and other similar terms are intended to have a broad meaning in conjunction with the common and accepted usage by those having ordinary skill in the art to which the subject matter of this disclosure pertains. As utilized herein, unless otherwise noted, the term "approximately" shall carry the meaning of being within 15 percent of the subject measurement, item, unit, or concentration, with preference given to the percent variance. It should be understood by those of skill in the art who review this disclosure that these terms are intended to allow a description of certain features described and claimed without restricting the scope of these features to the exact numerical ranges provided. Accordingly, the embodiments are limited only by the following claims and equivalents thereto. All publications and patent documents cited in this application are incorporated by reference in their entirety for all purposes to the same extent as if each individual publication or patent document were so individually denoted.

All numeric values are herein assumed to be modified by the term "about", whether or not explicitly indicated. The term "about" generally refers to a range of numbers that one of skill in the art would consider equivalent to the recited value (e.g., having the same function or result). In many instances, the terms "about" may include numbers that are rounded to the nearest significant figure.

The recitation of numerical ranges by endpoints includes all numbers within that range (e.g. 1 to 5 includes 1, 1.5, 2, 2.75, 3, 3.80, 4, and 5).

One skilled in the art will also readily recognize that where members are grouped together in a common manner, such as in a Markush group, the present invention encompasses not only the entire group listed as a whole, but each member of the group individually and all possible subgroups of the main group. Accordingly, for all purposes, the present invention encompasses not only the main group, but also the main group absent one or more of the group members. The present invention also envisages the explicit exclusion of one or more of any of the group members in the claimed invention.

Any element in a claim that does not explicitly state "means for" performing a specified function, or "step for" performing a specific function, is not to be interpreted as a "means" or "step" clause as specified in 35 U.S.C. § 112 (f). In particular, the use of "step of" in the claims herein is not intended to invoke the provisions of 35 U.S.C. § 112 (f).

The invention claimed is:

1. A method for creating a hydrophilic antimicrobial diamond coating on a silicon or glass surface comprising the steps of:
   providing a silicon or glass surface;
   creating a second surface by seeding a plurality of nanodiamond particles on the silicon or glass surface by microwave plasma chemical vapor deposition (MPCVD) such that each of the plurality of nanodiamond particles has a grain size of approximately 2-5 nm;
   forming a silver nitrate and hydroxylamine solution by mixing a silver nitrate solution of approximately 0.03-0.08 mg/L with hydroxylamine at a predetermined temperature;
   creating a third surface comprising:
      seeding a plurality of silver nanoparticles onto the second surface by spraying the silver nitrate and hydroxylamine solution onto the second surface, and maintaining the silver nitrate and hydroxylamine solution on the second surface for a predetermined time; and
   exposing the third surface to an oxygen plasma treatment for 10-40s, at a power of approximately 40 W, a pressure of 100-200 mTorr, and an oxygen flow rate of 20-25 sccm.

2. The method of claim 1, wherein the MPCVD includes a chamber having a pressure lower than atmospheric pressure and a mixture of gases flowing into the chamber, the mixture of gases comprising:
   methane at a flow rate of 1.2 sccm,
   hydrogen at a flow rate of 17 sccm, and
   argon at a flow rate of 400 sccm; and
   the chamber generating a plasma ball from a microwave plasma source wherein the plasma has a temperature of between approximately 400-800° C. with an input power of 2100 W and a frequency of 915 MHz.

3. The method of claim 1 wherein each of the plurality of nanodiamond particles has a grain size of approximately 5 nm.

4. The method of claim 1 wherein the second surface has a thickness between approximately 200 nm to 600 nm.

5. The method of claim 1 wherein the predetermined time for maintaining the silver nitrate and hydroxylamine solution on the second surface is approximately 2 hours.

6. The method of claim 1 wherein the predetermined temperature is 25° C.

7. The method of claim 1 wherein the step of exposing the third surface to an oxygen plasma treatment includes exposing the third surface to the oxygen plasma treatment for 40s, at a power of 40 W, a pressure of 160 mTorr, and an oxygen flow rate of 22 sccm.

8. The method of claim 1 wherein the hydrophilic antimicrobial diamond coating on the silicon or glass surface transmits light up to 90% in the visible spectrum.

9. The method of claim 1 wherein the hydrophilic antimicrobial diamond coating on the silicon or glass surface is optically transparent while maintaining at least 87% optical transmission throughout the visible spectrum.

10. The method of claim 1 wherein the hydrophilic antimicrobial diamond coating on the silicon or glass surface comprises a superhydrophilic antimicrobial diamond coating (SADC) on the silicon or glass surface.

11. The method of claim 10 wherein the SADC is antifogging and reduces bacterial attachment to approximately zero percent coverage.

12. A method for creating a hydrophilic antimicrobial diamond coating on a silicon or glass surface comprising the steps of:
   providing a silicon or glass surface;
   creating a second surface by seeding a plurality of nanodiamond particles on the silicon or glass surface by microwave plasma chemical vapor deposition (MPCVD) such that each of the plurality of nanodiamond particles has a grain size of approximately 2-5 nm;
   creating a third surface by exposing the second surface to an oxygen plasma treatment for 10-40s, at a power of approximately 40 W, a pressure of 100-200 mTorr, and an oxygen flow rate of 20-25 sccm;
   forming a silver nitrate and hydroxylamine solution by mixing a silver nitrate solution of approximately 0.03-0.08 mg/L with hydroxylamine at a predetermined temperature;
   seeding a plurality of silver nanoparticles onto the third surface by spraying the silver nitrate and hydroxylamine solution onto the third surface; and
   maintaining the silver nitrate and hydroxylamine solution on the third surface for a predetermined time.

13. The method of claim 12 wherein the MPCVD includes a chamber having a pressure lower than atmospheric pressure and a mixture of gases flowing into the chamber, the mixture of gases comprising:
   methane at a flow rate of 1.2 sccm,
   hydrogen at a flow rate of 17 sccm, and
   argon at a flow rate of 400 sccm; and
   the chamber generating a plasma ball from a microwave plasma source wherein the plasma has a temperature of between approximately 400-800° C. with an input power of 2100 W and a frequency of 915 MHz.

14. The method of claim 12 wherein each of the plurality of nanodiamond particles has a grain size of approximately 5 nm.

15. The method of claim 12, wherein the second surface has a thickness between approximately 200 nm to 600 nm.

16. The method of claim 12 wherein the predetermined time for maintaining the silver nitrate and hydroxylamine solution on the third surface is approximately 2 hours.

17. The method of claim 12 wherein the predetermined temperature is 25° C.

18. The method of claim 12 wherein the step of creating a third surface by exposing the second surface to an oxygen plasma treatment further includes exposing the second surface to the oxygen plasma treatment for 40s, at a power of 40 W, a pressure of 160 mTorr, and an oxygen flow rate of 22 sccm.

19. The method of claim 12 wherein the hydrophilic antimicrobial diamond coating on the silicon or glass surface transmits light up to 90% in the visible spectrum.

20. The method of claim 12 wherein the hydrophilic antimicrobial diamond coating on the silicon or glass surface is optically transparent while maintaining at least 87% optical transmission throughout the visible spectrum.

* * * * *